United States Patent [19]

Mertens et al.

[11] Patent Number: 4,690,098

[45] Date of Patent: Sep. 1, 1987

[54] VACUUM VAPOR-DEPOSITION SYSTEM

[75] Inventors: Horst M. Mertens, Munich; Leonhard Bögl, Buchbach, both of Fed. Rep. of Germany

[73] Assignees: ATOMIKA Technische Physik GmbH, Munich; Max-Planck-Gesellschaft zur Foerderung der Wissenschaften e.V., Goettingen, both of Fed. Rep. of Germany

[21] Appl. No.: 792,700

[22] Filed: Oct. 29, 1985

[51] Int. Cl.$^4$ .............................................. C23C 14/26
[52] U.S. Cl. .................................... 118/727; 118/728; 118/733
[58] Field of Search ........................ 118/727, 728, 733

[56] References Cited

U.S. PATENT DOCUMENTS

| | | | |
|---|---|---|---|
| 2,551,389 | 5/1951 | Oliver | 118/733 |
| 3,625,180 | 12/1971 | Smith | 118/727 |
| 3,714,925 | 2/1973 | Helm | 118/727 |
| 4,137,865 | 2/1979 | Cho | 118/49.1 |
| 4,201,152 | 5/1980 | Luscher | 118/712 |
| 4,201,746 | 5/1980 | Burd et al. | 422/250 |
| 4,226,208 | 10/1980 | Nishida | 118/725 |
| 4,392,453 | 7/1983 | Luscher | 118/726 |

FOREIGN PATENT DOCUMENTS

| | | |
|---|---|---|
| 1519912 | 6/1970 | Fed. Rep. of Germany . |
| 3310044 | 9/1984 | Fed. Rep. of Germany . |
| 413217 | 6/1974 | U.S.S.R. .............................. 118/727 |

OTHER PUBLICATIONS

DE-Prospekt: Varian, Molecular Beam Epitaxy System, 1977, J. Applied Physics, 46, No. 6, Jun. 1975, pp. 2366-2374.

Primary Examiner—Richard Bueker
Attorney, Agent, or Firm—Henry C. Nields

[57] ABSTRACT

In a vacuum vapor-deposition system a substrate holder is arranged stationary in the main part of a vapor-deposition chamber. Evaporation apparatuses are arranged on the floor of the vapor-deposition chamber, which is moveably connected to the main part of the vacuum-deposition chamber via a bellows and can swivel about two mutually intersecting axes or be displaced along two mutually intersecting axes with respect to the main part by means of two drive mechanisms. In this way the thermostatization of the substrate and the production of very uniform layers is facilitated.

7 Claims, 4 Drawing Figures

VACUUM VAPOR-DEPOSITION SYSTEM

BACKGROUND OF THE INVENTION

1. Technical Field

The present invention relates to a vacuum vapor-deposition system which is suitable for production of epitaxial layers in accordance with the molecular beam process.

2. Background Art

In the vapor deposition of thin layers of high uniformity, as are necessary e.g. in molecular beam epitaxy and also in the manufacture of interference filters and the like, measures are necessary to equalize the unavoidable locally different densities of the atomic or molecular beams going out from the vapor-deposition-material source or sources. In the known vapor depostion systems there is provided for this purpose a substrate holder which gives a simple or complex rotation of the substrate to be coated, while the evaporator or vapor-deposition-material source is held stationary in the vacuum chamber below the substrate support. The vapor-deposition-material source, which e.g. can consist of so-called Knudsencells, are in general provided at any given time with a movable shutter or other shield mechanism, which can be arranged between the source in question and the substrate, in order to release the beam of evaporation material directed from the source in question to the substrate.

A device for thermostating the substrate is usually arranged on the substrate holder. One disadvantage of the known vacuum vapor-deposition systems is that the mechanisms for movement of the substrate are exposed to the ultra-high vacuum and deposits from the evaporated material; moreover, the thermostating of the moveable substrate holder is difficult. Finally, the uniformity of the deposit often leaves much to be desired.

Accordingly, the problem underlying the present invention was further to develop from a vaccum vapor-deposition system of the type mentioned at the beginning hereof, so that a very high uniformity of the vapor-deposited layers would be achieved, and the agitating mechanisms necessary for rendering the deposit uniform could be arranged outside the vacuum.

SUMMARY

The aforementioned problem was solved by the invention by providing a vacuum vapor-deposition system with a vacuum-tight vapor-deposition chamber, in which apparatus for holding a substrate for at least one substrate to be coated is arranged, the said substrate-holding apparatus being arranged at a first part of the wall of the vapor-deposition chamber, and an evaporation apparatus arranged at a second part of the wall of the vapor-deposition chamber with at least one heatable vapor-deposition material source. Both parts of the wall of the evaporation chamber are connected with each other via a vacuum-tight connecting apparatus, which permits movement of the two parts with respect to each other, and are coupled to a drive mechanism which produces the movement between them. Further forms and advantageous arrangements of the vacuum vapor deposition system according to the invention include forming the second part of the wall of the vapor-deposition chamber as the floor of the evaporation chamber; including a bellows in the vacuum-tight conecting apparatus; supporting both parts of the wall of the vapor-deposition chamber so as either to swivel in relation to each other or else to be displaced in relation to each other in translational movement.

Since no complicated movements of the substrate are necessary in the vacuum vapor deposition system according to the invention, in order to be able to produce thin layers of high uniformity, and the substrate can rest during the coating, the thermostatization is allowed to be carried out very exactly and the crystalline growth of vapor-deposited layers proceeds continuously. A further advantage of the present invention resides in the fact that with simple means several degrees of freedom of movement of the vaporization apparatus with respect to the substrate can be achieved, and therewith a substantially higher uniformity of coating.

All drive and control elements for the evaporation apparatus can be arranged outside the vapor deposition chamber, which simplifies their construction and heightens their reliability.

BRIEF DESCRIPTION OF THE DRAWING

Hereinafter a preferred embodiment of the invention will be explained in more detail with reference to the drawings, in which.

DESCRIPTION OF THE PREFERRED EMBODIMENTS

Figure 1:
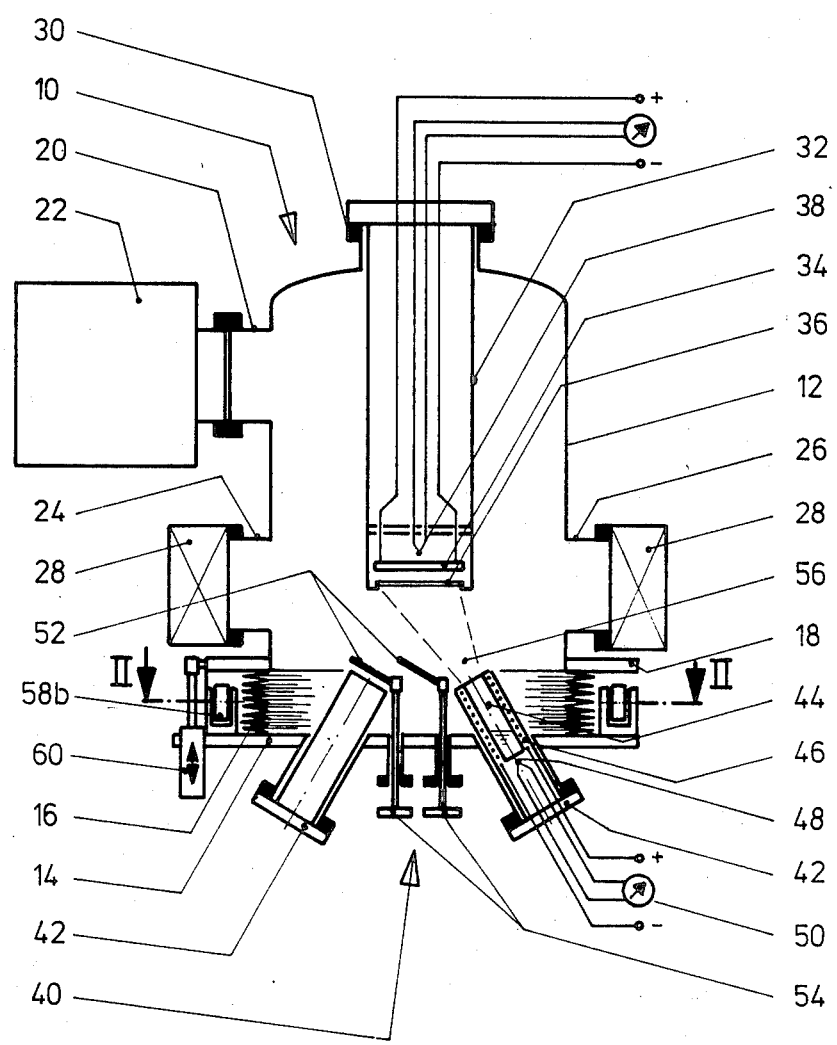
FIG. 1 is a somewhat schematic side view, broken away, of a vacuum vapor-deposition system according to the presently preferred embodiment of the invention.

The vacuum vapor-deposition system shown in the drawings includes a vapor-deposition chamber 10, the wall of which shows a substantially bell-shaped upper main part 12 open at the bottom, and a flt or flange-type lower floor-part 14, which are connected to each other vacuum tight and moveably relative to one another via a vacuum-tight connecting apparatus, in particular a bellows 16.

The lower end of the main part 12, to which one end of the bellows 16 is brought, is connected with a stationary annular base plate 18, which forms one part of a stationary frame (not otherwise further shown), which holds the vacuum vapor-deposition system as a whole.

The main part 12 shows in the usual manner at least one connection support 20 for a vacuum pump 22, connection supports 24, 26 for valves or locks 28 (shown only schematically) and a connection support 30 located on top in the middle for a substrate-holding device 32. The substrate-holding device 32 includes an electric heating element 34 for the thermostating of at least one substrate 36 as well as a temperature sensor 38 for measurement of the substrate temperature.

On the flat-shaped floor-part 14 of the vapor deposition chamber 10 there is arranged evaoration apparatus shown in its entirety by the reference numeral 40. The evaporation apparatus 14 can contain e.g. several vapor-deposition-material sources in the form of Knudsen cells 42, which in turn can contain at any given time a tubular evaporation chamber 44 open towards the interior of the vapor deposition chamber, a heating apparatus 46 surrounding this in the form of an electrical resistance heating coil and a temperature sensor 48, which is connected to a thermometer 50. The evaporation apparatus 40 includes further for each vapor deposition material source an apparatus which allows the beam of evaporated material from the particular source which is directed on the substrate 34 to be released or to be kept from the substrate. These apparatuses can for example at any given time consist of a flat shutter 52, which can be flipped, by means of activation apparatus 54 operable from outside, in front of the exit aperture of the pertinent vapor-deposition-material source, as is shown in the case of the left cell 42, or it can be flipped out of the way of the atomic or molecular beam 56 emerging from the particular source, as is shown in the case of the right cell 42 in FIG. 1.

In accordance with the invention the floor-part 14 is installed moveable with respect to the main part 12 which is rendered stationary by means of the base plate 18, and indeed preferably and advantageously in such a manner that the floor-part 14 with the evaporation apparatus 40 can carry out a swivel movement about two axes and thereby an agitation movement. According to an equally advantageous alternative (or additionally) an apparatus is provided for translational displacement of the floor-part with respect to the main part in at least one direction, as well be expalined hereinafter with respect to FIG. 4.

Figure 2:
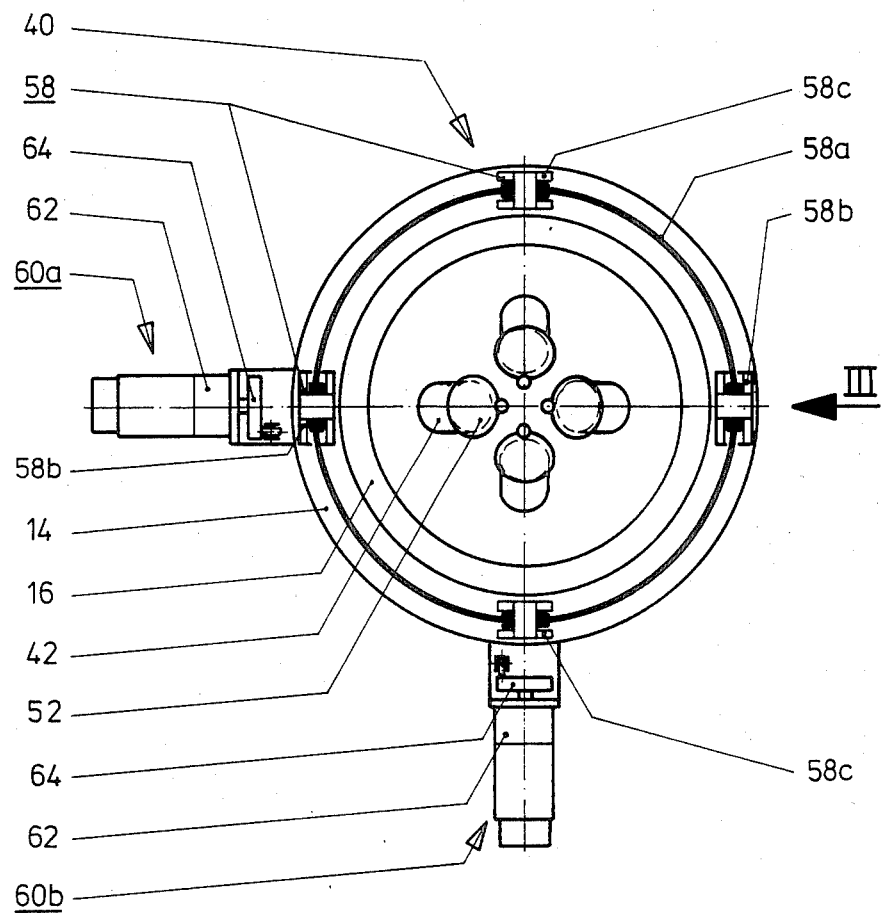
FIG. 2 is a partial view in the plane II of FIG. 1, from which may be seen details of gimbals supporting a moveable floor-part of the vapor deposition chamber.
Figure 3:
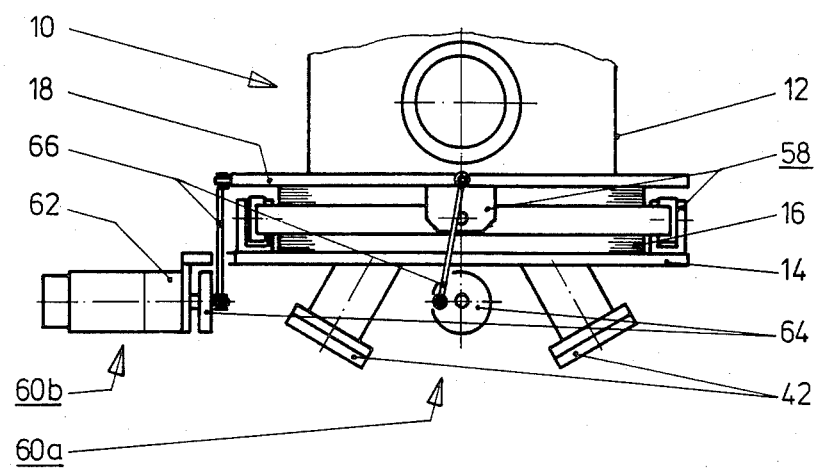
FIG. 3 is a side view seen in the direction of the arrow III in FIG. 2.

In order to make possible in the embodiment of FIGS. 1-3 the swivel and agitation movement of the evaporaion apparatus 40 with respect to the stationary substrate holder 52, the floor-part 14 is supported on the base plate 18 via gimbals 58 shown in more detail in FIG. 2. The gimbals 58 includes a ring 58a which has a swivel connection to the floor-part 14 via a pair of trestle supports 58b and to the base plate 18 via a second pair of trestle supports 58c displaced 90°. Further there are provided two drive mechanisms 60a and 60b displaced with respect to each other in the circumferential direction by e.g. 90°. The drive mechanisms are so connected to the generally somewhat circular floor-part 14 and the base plate 18, that they allow the base plate, at any given time to swivel about one of two mutually intersecting axes, which extend in planes which are at least approximately parallel to the plane of the base plate. The drive mechanisms 60a and 60b, of which only one pair is visible in FIG. 1, are controllable independently of one another, so that the floor-part 14 can carry out independent oscillating swivel movements about both axes and thus the material beam 56 can carry out a swivel movement practically at will, something after the manner of Lissajous figures.

The drive apparatuses 60 can include for example hydraulic or pneumatic cylinders, magnetic coils, mechanical eccentrics or the like. Preferred is an eccentric 64 driven by an electric motor 62 with variable RPM, since in this case the oscillation frequencies may be controlled most easily. The electric motors are fastened to the floor-part 14 (or to the base plate 18), and the eccentric 64 of each electric motor 62 is linked to support pivots provided on the base plate 18 (or the base part 14) via a coupling bar 66. The RPM of the electric motors are controllable independently from one another in a known manner, so that the floor-part 14 with the vapor deposition apparatuses can be swiveled with respect to the substrate holding apparatus 32 about two mutually intersecting axes.

Figure 4:
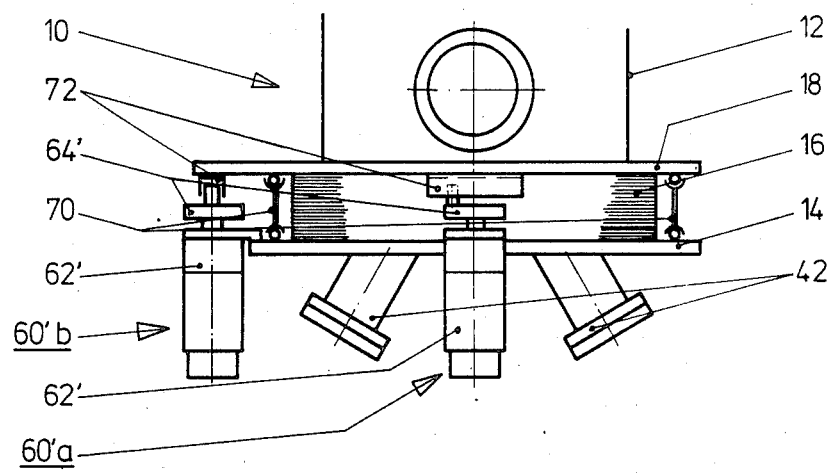
FIG. 4 is a view corresponding to FIG. 3, of a mechanism for translatory back-and-forth movement of the floor-part of the vapor deposition chamber.

In the embodiment shown in FIG. 4, floor-part 14 is displaceable translatorily with respect to the main part 12 of the wall of the vacuum chamber in two directions which intersect one another e.g. by an angle of 90°. The floor-part 14 is for this purpose mounted on the base plate 18 through three or more pendulum supports 70, the ends of which are connected to the floor-part 14 and the base plate 18, respectively, via ball-and-socket joints, so that the floor-part 14 can be displaced at will substantially within its plane with respect to the main part 12. In FIG. 4 the displacement occurs in two directions substantially perpendicular to one another by means of two electric motors 62', the RPM of which are controllable independently of one another. The electric motors 62' drive at any given time an eccentric disc 64', which carries an eccentric post, which runs in a U-shaped guide 72 running tangentially and mounted on the base-plate.

Having thus described the principles of the invention, together with illustrative embodiments thereof, it is to be understood that although specific terms are employed they are used in a generic and descriptive sense, and not for purposes of limitation, the scope of the invention being set forth in the following claims.

We claim:

1. A vacuum-vapor-deposition system comprising a vacuum-tight vapor-deposition chamber the wall whereof includes a fixed part and a movable part, a substrate-holder adapted to hold at least one substrate to be coated arranged at said fixed part, an evaporation apparatus arranged at said movable part and having at least one heatable vapor-deposition material source, vacuum-tight connecting apparatus adapted to connect said fixed part to said movable part and means to permit a swivel motion, around two nonparallel axes, of the movable part while the fixed part remains stataionary and means coupled to said fixed part and said movable part for producing said swivel motion throughout deposition.

2. Vacuum vapor-deposition system in accordance with claim 1, wherein said movable part forms the floor of the evaporation chamber.

3. Vacuum vapor-deposition system in accordance with claim 1, wherein said vacuumtight connecting apparatus includes a bellows.

4. Vacuum vapor-deposition system in accordance with claim 1, wherein said fixed and movable parts are supported movably with respect to each other by means of gimbals and can be swiveled in relation to each other about two intersecting axes by means of two drive mechanisms.

5. Vacuum vapor-deposition system in accordance with claim 1, wherein said movable part is displaceably supported in relation to said fixed part.

6. Vacuum vapor-deposition system according to claim 5, incuding two drive mechanisms for independent displacement of said moveable part in relation to said fixed part in two mutually intersecting directions.

7. Vacuum vapor-deposition system in accordance with claim 1, wherein said drive mechanism includes two drive motors, the RPM of which is controllable independently of one another.

* * * * *